(12) United States Patent
Hatano et al.

(10) Patent No.: US 11,953,825 B2
(45) Date of Patent: Apr. 9, 2024

(54) IMPRINT APPARATUS, IMPRINT METHOD, AND MANUFACTURING METHOD OF SEMICONDUCTOR DEVICE

(71) Applicant: Kioxia Corporation, Tokyo (JP)

(72) Inventors: Masayuki Hatano, Kanagawa (JP); Kei Kobayashi, Kanagawa (JP); Tetsuro Nakasugi, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/154,995

(22) Filed: Jan. 16, 2023

(65) Prior Publication Data

US 2023/0221635 A1  Jul. 13, 2023

Related U.S. Application Data

(62) Division of application No. 16/297,875, filed on Mar. 11, 2019.

(30) Foreign Application Priority Data

Aug. 28, 2018  (JP) .................................. 2018-159345

(51) Int. Cl.
*G03F 7/00* (2006.01)
*H01L 21/027* (2006.01)

(52) U.S. Cl.
CPC ........ *G03F 7/0002* (2013.01); *H01L 21/0274* (2013.01)

(58) Field of Classification Search
CPC ............................ G03F 7/0002; H01L 21/0274
See application file for complete search history.

(56) References Cited

U.S. PATENT DOCUMENTS 6,062,288 A * 5/2000 Tateyama ............... B08B 3/08
118/316
6,906,782 B2 * 6/2005 Nishi .................. G03F 7/70716
355/72

(Continued)

FOREIGN PATENT DOCUMENTS

JP   2009-212449 A   9/2009
JP   4963718 B       6/2012

(Continued)

*Primary Examiner* — Jacob T Minskey
*Assistant Examiner* — Wayne K. Swier
(74) *Attorney, Agent, or Firm* — Finnegan, Henderson, Farabow, Garrett & Dunner, LLP

(57) ABSTRACT

According to one embodiment, an imprint apparatus that presses a fine pattern of an original plate against a photo-curable resin dropped onto a substrate, and transfers the fine pattern to the photo-curable resin by applying light, includes a dropping unit that drops the photo-curable resin onto a shot region obtained by dividing the substrate into a plurality of sections, an original plate supporting unit that stamps the original plate on the photo-curable resin on the substrate, the original plate being supported the fine pattern towards the substrate side, and a substrate supporting unit that supports the substrate and moves the substrate such that a position of a predetermined shot region of the substrate is a dropping position of the dropping unit or a stamping position of the original plate, in which the dropping unit is controlled such that the photo-curable resin is sequentially dropped onto the plurality of shot regions of the substrate, and the original plate supporting unit is controlled such that the fine pattern is transferred by sequentially stamping the original plate on the photo-curable resin dropped onto the plurality of shot regions, while operating the substrate supporting unit.

11 Claims, 16 Drawing Sheets

(56) References Cited

U.S. PATENT DOCUMENTS

| | | |
|---|---|---|
| 9,023,432 B2 | 5/2015 | Kawamura |
| 10,105,892 B2 | 10/2018 | Nakagawa et al. |
| 2009/0224436 A1 | 9/2009 | Mikami et al. |
| 2012/0244719 A1 | 9/2012 | Hatano et al. |
| 2014/0027955 A1 | 1/2014 | Wakabayashi et al. |
| 2014/0037859 A1 | 2/2014 | Kobiki |
| 2014/0339721 A1 | 11/2014 | Toshima et al. |
| 2015/0042012 A1 | 2/2015 | Nakagawa et al. |
| 2017/0157810 A1 | 6/2017 | Kondo |
| 2019/0079391 A1 | 3/2019 | Fukuhara et al. |

FOREIGN PATENT DOCUMENTS

| | | |
|---|---|---|
| JP | 2012-204380 A | 10/2012 |
| JP | 2013-175631 A | 9/2013 |
| JP | 5611912 B2 | 10/2014 |
| JP | 2016-54231 A | 4/2016 |
| JP | 2017-145320 A | 8/2017 |
| JP | 2019-50313 A | 3/2019 |

\* cited by examiner

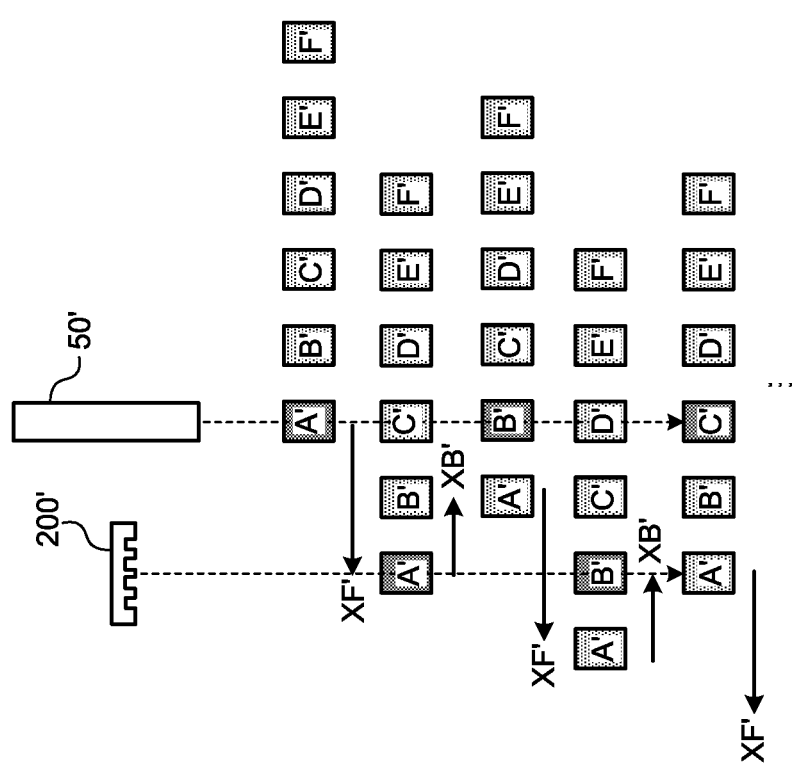
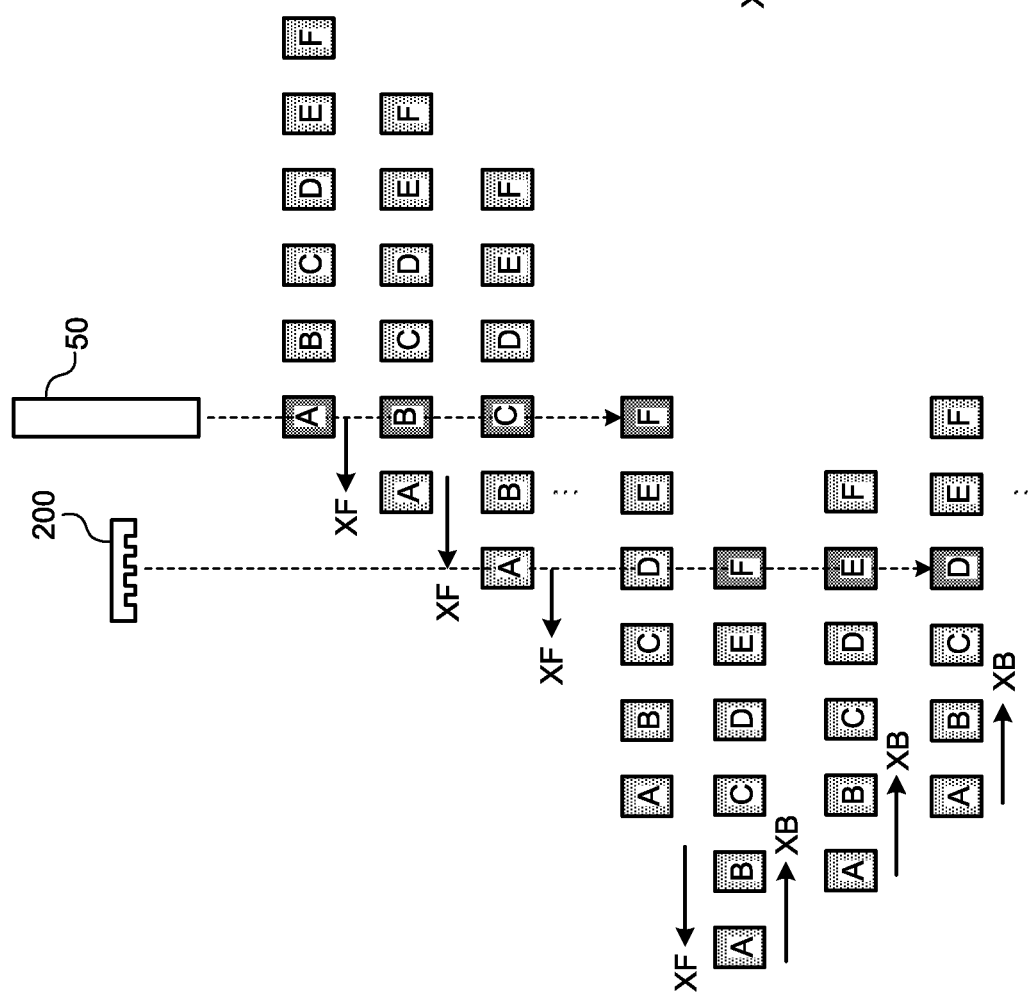

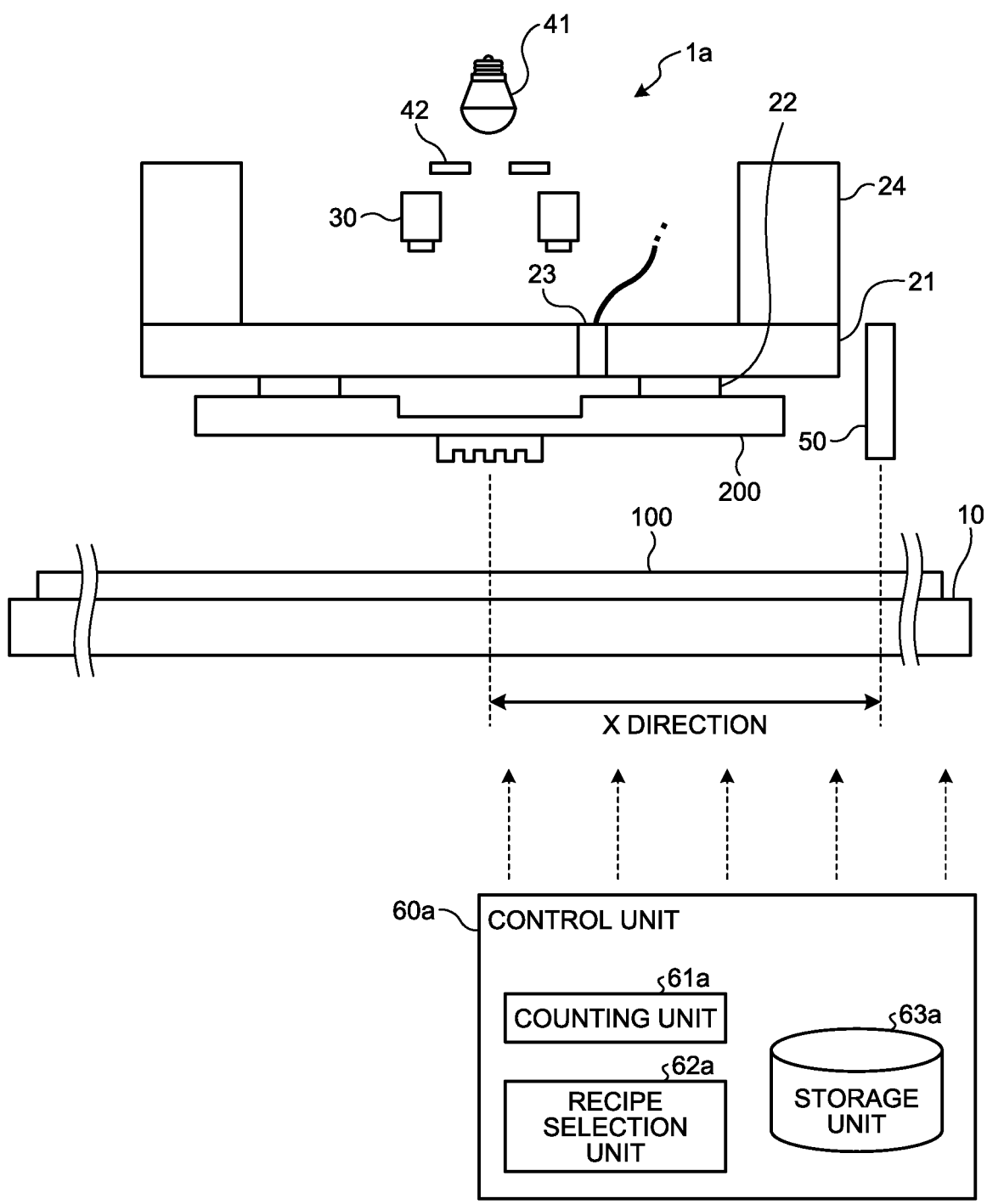

FIG.8A

|  | TIME: SHORT | TIME: LONG |
|---|---|---|
| RESIST DROPPING AMOUNT | ↓ | ↑ |

FIG.8B

|  | TIME: SHORT | TIME: LONG |
|---|---|---|
| GAP BETWEEN Temp AND Waf | ↑ | ↓ |
| PRESSING FORCE | ↓ | ↑ |
| PRESSING SPEED | ↓ | ↑ |
| RELEASING SPEED | ↓ | ↑ |

FIG.11

| | PROTRUSION DEFECT | PATTERN DEFECT | RESIDUAL LAYER THICKNESS |
|---|---|---|---|
| GAP BETWEEN Temp AND Waf ← | ← | ← | ← |
| PRESSING FORCE ← | ← | → | → |
| PRESSING SPEED ← | → | ← | ← |
| RELEASING SPEED ← | → | ← | ← |
| RESIST DROPPING AMOUNT ← | ← | → | ← |

FIG.16

| | PROTRUSION DEFECT | PATTERN DEFECT | RESIDUAL LAYER THICKNESS |
|---|---|---|---|
| LIGHT IRRADIATION WITH RESPECT TO DROPLET | → | ← | ← |
| GAP BETWEEN Temp AND Waf | → | ← | ← |
| PRESSING FORCE | ← | → | → |
| PRESSING SPEED | → | ← | ← |
| RELEASING SPEED | → | ← | ← |
| RESIST DROPPING AMOUNT | ← | → | ← |

FIG.17
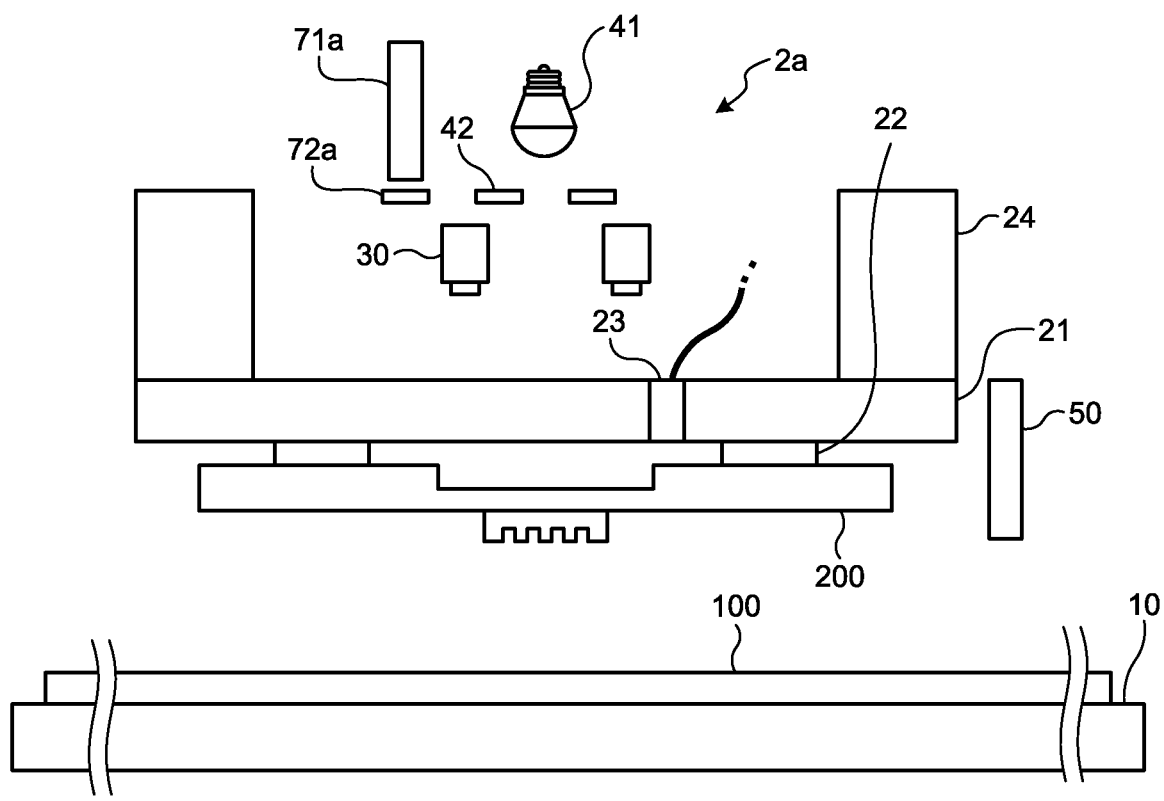
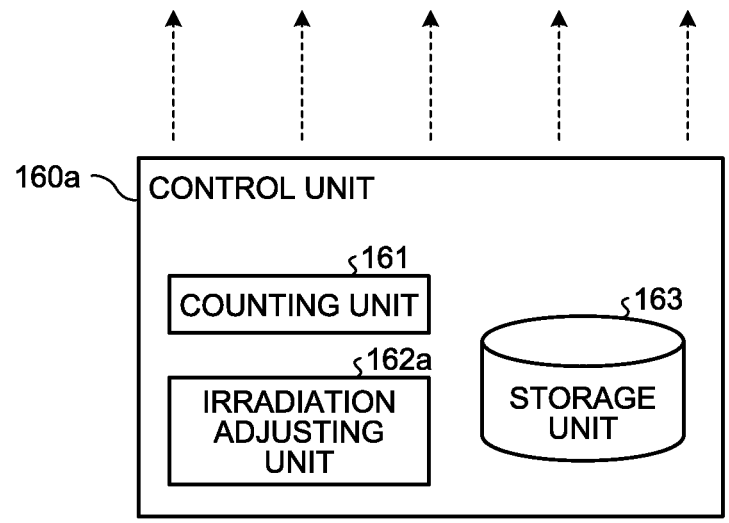

IMPRINT APPARATUS, IMPRINT METHOD, AND MANUFACTURING METHOD OF SEMICONDUCTOR DEVICE

CROSS-REFERENCE TO RELATED APPLICATIONS

This application is a divisional of application Ser. No. 16/297,875, filed on Mar. 11, 2019, which is based upon and claims the benefit of priority from Japanese Patent Application No. 2018-159345, filed on Aug. 28, 2018; the entire contents of which are incorporated herein by reference.

FIELD

Embodiments described herein relate generally to an imprint apparatus, an imprint method, and a manufacturing method of a semiconductor device.

BACKGROUND

An imprint method has been proposed as a method of forming a fine pattern in a manufacturing process of a semiconductor device. In the imprint method, a resist is dropped onto a film to be processed, that is formed on a substrate, a template on which a fine pattern is formed, is pressed against the resist, and a concave portion of the template is filled with the resist, and then, the resist is cured by being irradiated with an ultraviolet ray.

BRIEF DESCRIPTION OF THE DRAWINGS

FIG. 6A is a schematic view illustrating an operation of a wafer stage in the imprint apparatus according to the first embodiment;

FIG. 6B is a schematic view illustrating an operation of a wafer stage in an imprint apparatus according to a comparative example;

FIG. 7 is a diagram illustrating a configuration example of an imprint apparatus according to a modification example of the first embodiment;

FIG. 8A is a dropping recipe table retained by the imprint apparatus according to the modification example of the first embodiment;

FIG. 8B is an imprint recipe table retained by the imprint apparatus according to the modification example of the first embodiment;

FIG. 11 is a diagram illustrating an example of a relationship between a processing parameter and finishing properties;

FIG. 16 is a diagram illustrating an example of a relationship between a processing parameter and finishing properties; and FIG. 17 is a diagram illustrating a configuration example of an imprint apparatus according to a first modification example of the second embodiment.

DETAILED DESCRIPTION

In general, according to one embodiment, an imprint apparatus that presses a fine pattern of an original plate against a photo-curable resin dropped onto a substrate, and transfers the fine pattern to the photo-curable resin by applying light, includes a dropping unit that drops the photo-curable resin onto a shot region obtained by dividing the substrate into a plurality of sections, an original plate supporting unit that stamps the original plate on the photo-curable resin on the substrate, the original plate being supported the fine pattern towards the substrate side, and a substrate supporting unit that supports the substrate and moves the substrate such that a position of a predetermined shot region of the substrate is a dropping position of the dropping unit or a stamping position of the original plate, in which the dropping unit is controlled such that the photo-curable resin is sequentially dropped onto the plurality of shot regions of the substrate, and the original plate supporting unit is controlled such that the fine pattern is transferred by sequentially stamping the original plate on the photo-curable resin dropped onto the plurality of shot regions, while operating the substrate supporting unit.

Hereinafter, the present invention will be described in detail with reference to the drawings. Furthermore, the present invention is not limited to the following embodiments. In addition, constituents in the following embodiments include constituents that can be easily conceived by a person skilled in the art or constituents that are substantially the same.

First Embodiment

A first embodiment will be described by using FIG. 1 to FIG. 11.

Configuration Example of Imprint Apparatus

Figure 1:
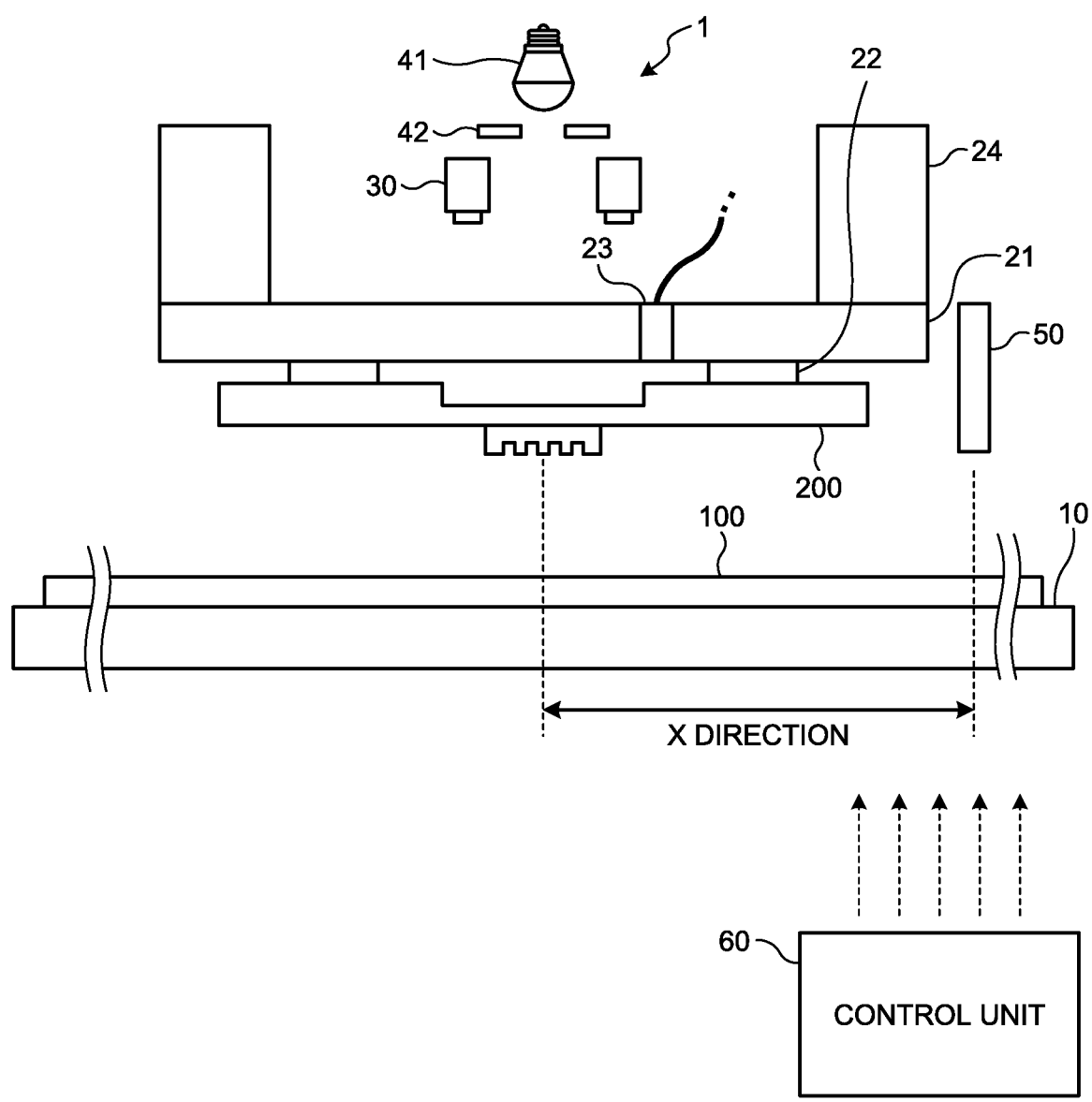
FIG. 1 is a diagram illustrating a configuration example of an imprint apparatus according to a first embodiment.

FIG. 1 is a diagram illustrating a configuration example of an imprint apparatus 1 according to a first embodiment. As illustrated in FIG. 1, the imprint apparatus 1 includes a wafer stage 10, a template stage 21, a template chuck 22, a pressurizing unit 23, a hoisting unit 24, an alignment unit 30, a light source 41, an aperture 42, a dropping unit 50, and a control unit 60.

The wafer stage 10 places the wafer 100 thereon, and is moved in the plane parallel to the placed wafer 100 (in the horizontal plane). The wafer stage 10 moves the wafer 100 to the lower side of the dropping unit 50 at the time of dropping the resist onto the wafer 100, and moves the wafer 100 to the lower side of the template 200 at the time of performing transfer processing with respect to the wafer 100. Here, a movement direction of the wafer stage 10 between the dropping unit 50 and the template 200, is an X direction.

The wafer 100, for example, is a semiconductor substrate such as a silicon substrate. Alternatively, the wafer 100 may be a glass substrate, a metal substrate, or the like. A film to be processed (not illustrated) is formed on the wafer 100.

The template 200, for example, is an original plate that is used in a nanoimprint lithography or the like. A fine pattern is three-dimensionally formed on a lower surface side of the template 200. The template 200 is configured of a transparent member such as glass or synthetic quartz.

The template stage 21 performs vacuum suction with the template chuck 22, and thus, retains the template 200 to the upper side of the wafer 100 such that the fine pattern is directed towards the lower side. The template stage 21 rises and falls by the hoisting unit 24 at a predetermined speed. In addition, the pressurizing unit 23 presses the template 200 against the resist (not illustrated) on the wafer 100 while pressurizing the rear surface of the template 200 with air pressure or the like.

The alignment unit 30 is disposed on the template stage 21. The alignment unit 30, for example, includes a microscope, an imaging device, and the like, which are not illustrated, and performs position detection of the wafer 100 or position detection of the template 200.

The light source 41, for example, is a device applying an ultraviolet ray, and is disposed on the upper side of the template stage 21. The ultraviolet ray passing through the aperture 42 from the light source 41, is applied from the upper side of the template 200 in a state where the template 200 is pressed against the resist.

The dropping unit 50 is a device dropping the resist onto the wafer 100 according to an ink jet method. An ink jet head of the dropping unit 50, includes a plurality of fine holes ejecting a liquid droplet of the resist, and drops a dot-like resist onto the wafer 100. For example, a photo-curable resin is used as the resist. In addition, hereinafter, the liquid droplet of the resist dropped into the shape of a dot, will be also referred to as a droplet.

The control unit 60, for example, is configured as a computer including a hardware processor such as a central processing unit (CPU), a memory, a hard disk drive (HDD), and the like. The control unit 60 controls each unit of the wafer stage 10, the template stage 21, the template chuck 22, the pressurizing unit 23, the hoisting unit 24, the alignment unit 30, the light source 41, the aperture 42, and the dropping unit 50.

Processing Example of Imprint Apparatus

Next, a processing example of the imprint apparatus 1 will be described by using FIG. 2 to FIG. 5.

Figure 2:
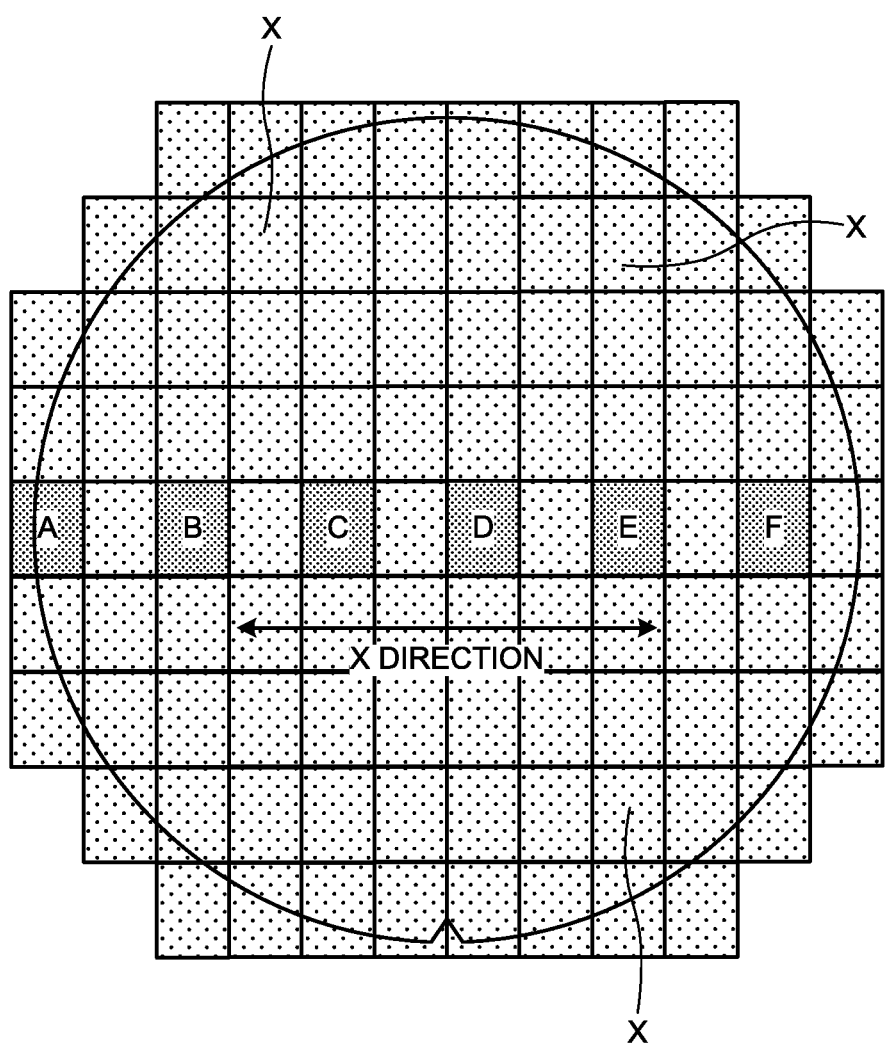
FIG. 2 is a schematic view of a wafer that is a processing target of the imprint apparatus according to the first embodiment.

FIG. 2 is a schematic view of the wafer 100 that is a processing target of the imprint apparatus 1 according to the first embodiment. As illustrated in FIG. 2, in imprint processing, the wafer 100 is partitioned into a plurality of shot regions X. Then, the dropping unit 50 drops the resist onto a predetermined number of shot regions X. Next, the template 200 is stamped on the shot region X onto which the resist is dropped. That is, the template 200 is contacted on the shot region X. In the stamping of the template 200, the template 200 is pressed against the resist on the wafer 100, and the fine pattern of the template 200 is transferred to the resist.

In FIG. 2, in shot regions X of one row, arranged in the X direction that is the movement direction of the wafer stage 10 between the dropping unit 50 and the template 200, shot regions A to F are collectively processed every other shot region. At this time, first, the resist is dropped onto the shot regions A, B, C, D, E, and F, in this order. Next, the template 200 is stamped on the shot regions F, E, D, C, B, and A, in this order. Such a state is illustrated in FIG. 3A and FIG. 3B to FIG. 5.

Figure 3A:
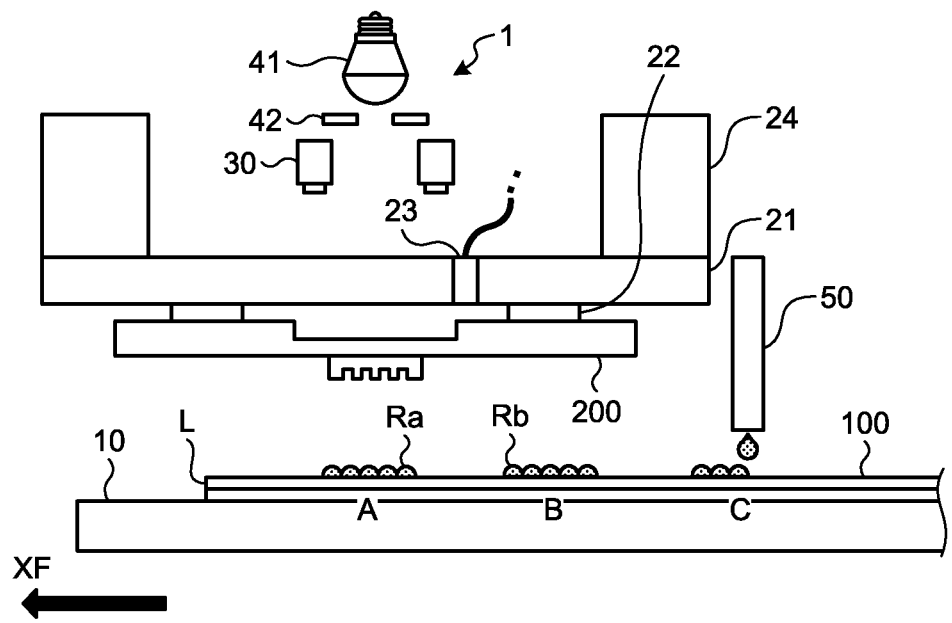
FIG. 3A and FIG. 3B are flow diagrams illustrating an example of a procedure of resist dropping processing of the imprint apparatus according to the first embodiment.
Figure 3B:
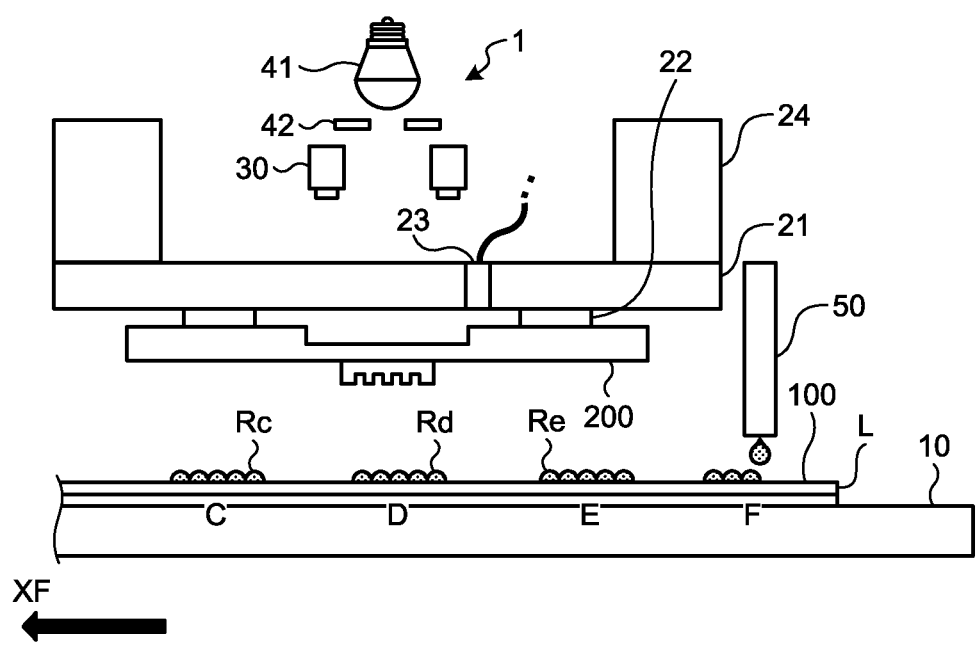

FIG. 3A and FIG. 3B are flow diagrams illustrating an example of a procedure of resist dropping processing of the imprint apparatus 1 according to the first embodiment. As illustrated in FIG. 3A and FIG. 3B, a film L to be processed is formed on the wafer 100. The wafer stage 10 of the imprint apparatus 1, moves the shot regions A, B, C, D, E, and F, in this order, to a resist dropping position of the dropping unit 50. The dropping unit 50 sequentially drops the droplet of the resist onto each of the shot regions A to F.

FIG. 3A illustrates a state in which the dropping of a droplet Ra with respect to the shot region A and the dropping of a droplet Rb with respect to the shot region B are ended, and the dropping of the resist with respect to the shot region C is performed. The dropping of the resist with respect to the shot region C is ended, and then, the wafer stage 10 is moved in an XF direction parallel to the X direction, and the shot region D of the wafer 100 is moved to the resist dropping position.

FIG. 3B illustrates a state in which the dropping of the resist with respect to the final shot region F to be collectively processed, is performed. The dropping of the resist with respect to the shot region F is ended, and then, the wafer stage 10 is further moved in the XF direction, and the shot region F is moved to a stamping position of the template 200.

Figure 4A:
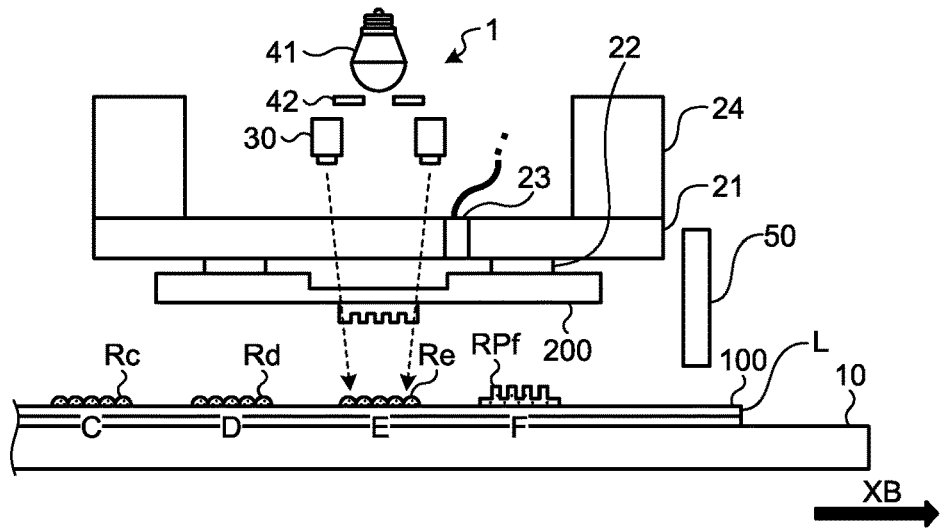
FIG. 4A to FIG. 4C are flow diagrams illustrating an example of a procedure of stamping processing of a template of the imprint apparatus according to the first embodiment.
Figure 4B:
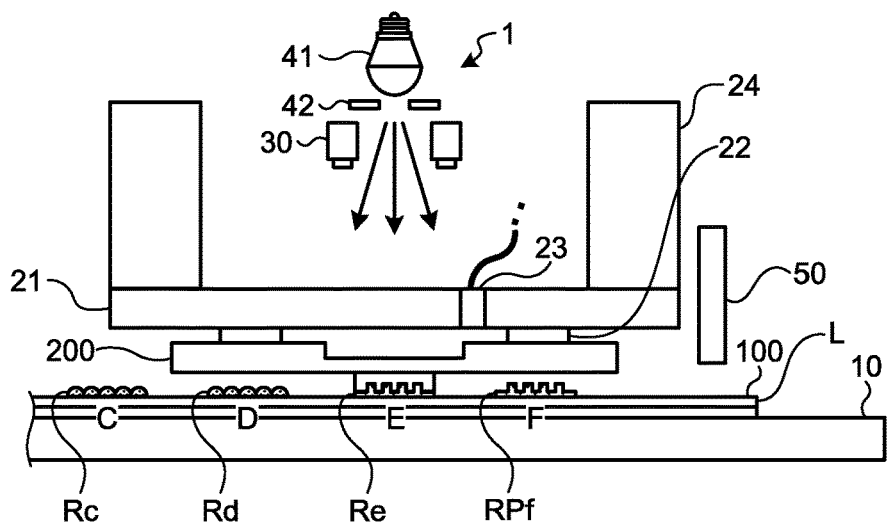
Figure 4C:
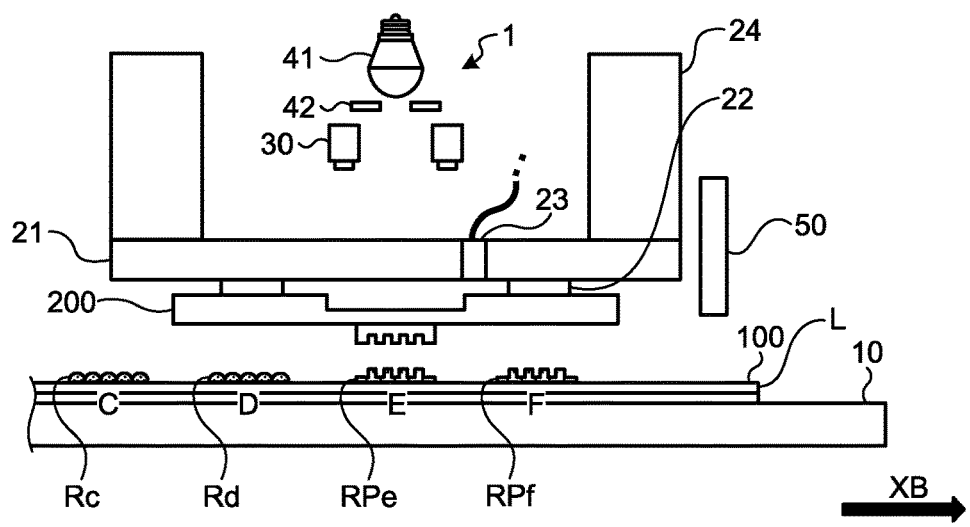

FIG. 4A to FIG. 4C and FIG. 5 are flow diagrams illustrating an example of a procedure of stamping processing of the template 200 of the imprint apparatus 1 according to the first embodiment. FIG. 4A to FIG. 4C illustrate a state in which the formation of a resist pattern RPf in the shot region F is ended, and the template 200 is stamped on a droplet Re in the shot region E.

As illustrated in FIG. 4A, in a case where the resist pattern RPf is formed in the shot region F, the wafer stage 10 is moved in an XB direction, and the shot region E is moved to the stamping position of the template 200. The alignment unit 30 detects the position of the wafer 100 and the template 200, and adjusts the position of the wafer 100 and the position of the template 200.

As illustrated in FIG. 4B, the hoisting unit 24 moves the template stage 21 to the lower side at a predetermined speed, and brings the template 200 into contact with the droplet Re on the wafer 100. The pressurizing unit 23 pressurizes the template stage 21 to the lower side. Accordingly, the template 200 is pressed against the droplet Re on the wafer 100. However, the template 200 has a slight distance from the wafer 100 such that the template 200 is not in contact with the wafer 100. In a case where such a state is retained for a predetermined time, a concave portion of the fine pattern of the template 200 is filled with the droplet Re.

In a state where the template 200 is pressed against the droplet Re, the ultraviolet ray passing through the aperture 42 from the light source 41, is applied to the droplet Re on the wafer 100 by being transmitted through a through hole (not illustrated) of the template stage 21, and the template 200. Accordingly, the droplet Re is cured. At this time, the shot regions X are collectively processed every other shot region, and thus, it is possible to prevent the resist in the shot region X adjacent to the droplet Re of a curing target, from being cured due to the influence of the irradiation.

As illustrated in FIG. 4C, the hoisting unit 24 moves the template stage 21 to the upper side at a predetermined speed, and releases the template 200 from a resist pattern RPe on the wafer 100. The resist pattern RPe is obtained by curing the fine pattern that is transferred to the droplet Re. A slight resist residual film due to a gap between the template 200 and the wafer 100, exists in each pattern of the resist pattern RPe.

As described above, in a case where the resist pattern RPe is formed in the shot region E, the wafer stage 10 is moved in the XB direction, and the shot region D is moved to the stamping position of the template 200. Thus, the template 200 is sequentially stamped on the shot regions F, E, D . . . .

Figure 5:
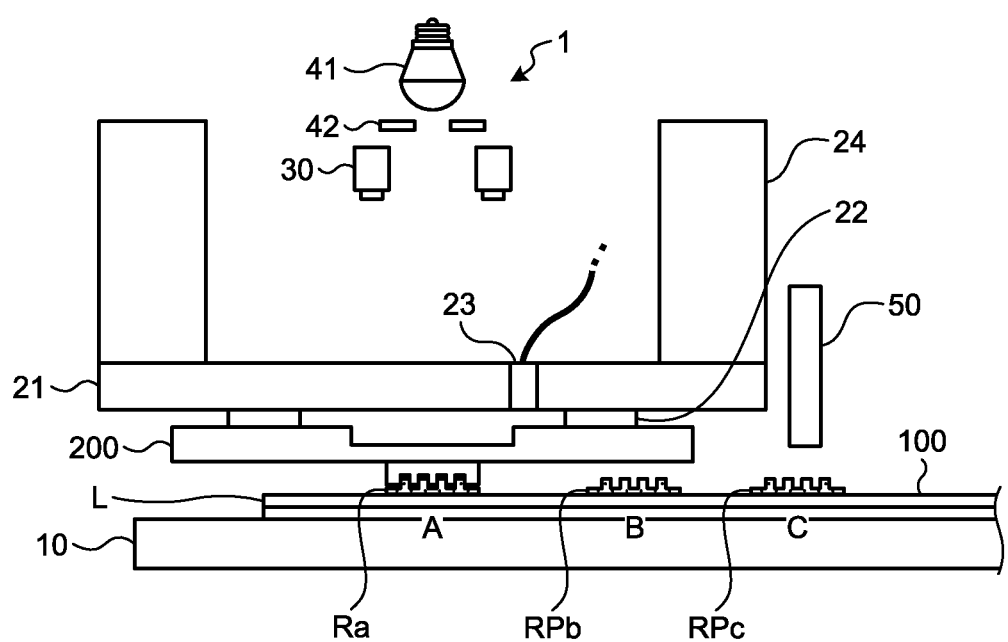
FIG. 5 is a flow diagram illustrating an example of the procedure of the stamping processing of the template of the imprint apparatus according to the first embodiment.

FIG. 5 illustrates a state in which the stamping of the template 200 with respect to the final shot region A to be collectively processed, is performed. As described above, the shot regions A to F are collectively processed. The imprint apparatus 1 performs the processing described above with respect to all of the shot regions on the wafer 100.

After that, the film L to be processed, formed on the wafer 100, is processed by using a resist pattern on which the fine pattern of the template 200 is stamped, as a mask. Thus, the formation of the film to be processed, the formation of the resist pattern, and the process of the film to be processed are repeated several times, and thus, a semiconductor device is manufactured.

Comparative Example

Next, the operation of the imprint apparatus 1 will be described while being compared to a comparative example, by using FIG. 6A and FIG. 6B. FIG. 6A is a schematic view illustrating the operation of the wafer stage 10 in the imprint apparatus 1 according to the first embodiment, and FIG. 6B is a schematic view illustrating an operation of a wafer stage in an imprint apparatus according to the comparative example.

As illustrated in FIG. 6B, in the imprint apparatus of the comparative example, the dropping of the resist and the stamping of the template are performed with respect to each shot region. Therefore, fist, a shot region A' is moved to a resist dropping position of a dropping unit 50', and the resist is dropped. Next, the wafer stage is moved in an XF' direction, the shot region A' is moved to a stamping position of the template 200', and a template 200' is stamped. Next, the wafer stage is moved to an XB' direction, a shot region B' is moved to the resist dropping position of the dropping unit 50', and the resist is dropped. Next, the wafer stage is moved in the XF' direction, the shot region B' is moved to the stamping position of the template 200', and the template 200' is stamped. Thus, in a method where the dropping of the resist and the stamping of the template 200' are performed with respect to each of the shot regions, it is inefficient since the wafer stage reciprocates between the resist dropping position of the dropping unit 50' and the stamping position of the template 200', several times.

As illustrated in FIG. 6A, in the imprint apparatus 1 of the first embodiment, the resist is dropped onto a predetermined number of shot regions X, and then, the template 200 is stamped on the shot regions X. Therefore, fist, the shot region A is moved to the resist dropping position of the dropping unit 50, and the droplet Ra is dropped. Next, the wafer stage 10 is moved in the XF direction, the shot region B is moved to the resist dropping position of the dropping unit 50, and the droplet Rb is dropped. Next, the wafer stage 10 is further moved in the XF direction, the shot region C is moved to the resist dropping position of the dropping unit 50, and a droplet Rc is dropped. Such a process is repeated up to the shot region F, the shot region F is moved to the stamping position of the template 200, and the template 200 is stamped. Next, the wafer stage 10 is moved in the XB direction, the shot region E is moved to the stamping position of the template 200, and the template 200 is stamped.

Thus, in the imprint apparatus 1 of the first embodiment, the movement direction of the wafer stage 10 is the XF direction without being changed, while the droplets Ra to Rf are dropped onto the shot regions A to F. In addition, the movement direction of the wafer stage 10 is the XB direction without being changed, while the template 200 is stamped on the shot regions F to A. That is, in the imprint apparatus 1 of the first embodiment, there is not waste in the operation of the wafer stage 10, and movement distance is short, compared to the comparative example. Accordingly, it is possible to efficiently perform the imprint processing in a shorter time.

Furthermore, in the first embodiment described above, in the example of FIG. 2, the dropping of the resist is performed in the order of the shot regions A, B, C, D, E, and F, and the stamping of the template 200 is performed in the order of the shot regions F, E, D, C, B, and A, but the order is not limited thereto. The dropping of the resist may be performed in the order of the shot regions A, B, C, D, E, and F, and for example, the stamping of the template 200 may be performed in the order of the shot regions A, B, C, D, E, and F. Alternatively, the processing of the shot regions A to F may be performed in other orders.

In addition, in the first embodiment described above, as illustrated in FIG. 3A and FIG. 3B to FIG. 5, an example in which six shot regions A to F are collectively processed, has been described, but it is not limited thereto. The number of shot regions X to be collectively processed may be greater than or equal to 2.

In addition, in the first embodiment described above, as illustrated in FIG. 3A and FIG. 3B to FIG. 5, an example in which the shot regions A to F of one row, arranged in the X direction that is the movement direction of the wafer stage 10 between the dropping unit 50 and the template 200, are collectively processed, has been described, but it is not limited thereto. The shot regions X of a plurality of rows, arranged in the X direction, may be collectively processed.

Thus, each of the shot regions X can be suitably processed in various orders and combinations, such that the wafer stage 10 is efficiently moved, on the premise that two or more shot regions X are collectively processed.

Modification Example

Next, an imprint apparatus of a modification example of the first embodiment, will be described by using FIG. 7 to FIG. 11. The imprint apparatus of the modification example of the first embodiment, is different from the first embodiment described above, in that a processing parameter is suitably changed in the shot regions to be collectively processed.

As with the first embodiment described above, for example, a case where the dropping of the resist is performed in the order of the shot regions A, B, C, D, E, and F, and the stamping of the template is performed in the order of the shot regions F, E, D, C, B, and A, will be considered.

In this case, a time from when the resist is dropped to when the template is stamped (hereinafter, also referred to as an "elapsed time") is different between the shot region A and the shot region F. That is, the elapsed time is long in the shot region A, and the elapsed time is short in the shot region F. The resist is dropped, and then, the droplet of the resist wet-spreads on the wafer under its own weight. For this reason, in the shot region A where the elapsed time is long, the spreading of the droplet is larger than that in the shot region F.

Therefore, in the imprint apparatus of the modification example of the first embodiment, the processing parameter in each of the shot regions is changed according to a spreading condition of the droplet, that is, the elapsed time.

FIG. 7 is a diagram illustrating a configuration example of an imprint apparatus 1a according to the modification example of the first embodiment. In the imprint apparatus 1a, a configuration of a control unit 60a controlling each unit, is different from that of the first embodiment. The same reference numerals as the reference numerals of the imprint apparatus 1 of the first embodiment, will be applied to other configurations, and the description thereof will be omitted.

As illustrated in FIG. 7, the control unit 60a includes a counting unit 61a, a recipe selection unit 62a, and a storage unit 63a. The counting unit 61a, the recipe selection unit 62a, and the storage unit 63a may be realized by allowing the CPU to execute a program, or may be realized by a dedicated hardware circuit. In addition, the storage unit 63a may be realized by an HDD or the like.

The counting unit 61a counts the order of dropping the resist onto the shot regions to be collectively processed. That is, according to the example described above, the counting unit 61a counts the order for each of the shot regions, such that the first dropping of the resist is performed with respect to the shot region A, and the third dropping of the resist is performed with respect to the shot region C. From the order of dropping the resist, it is possible to grasp the elapsed time of each of the shot regions.

The recipe selection unit 62a selects recipes having a plurality of different processing parameters, according to the order of dropping the resist, that is, the elapsed time. Examples of the processing parameter include a gap between the template 200 and the wafer 100, a pressing force, a pressing speed, a releasing speed, a resist dropping amount, and the like.

The gap between the template 200 and the wafer 100, is a gap between the template 200 and the wafer 100 at the time of pressing the template 200 against the wafer 100, and can be changed by adjusting a falling amount of the template stage 21 with the hoisting unit 24. In addition, at least any one of the template stage 21 and the wafer stage 10 is inclined, and thus, the gap with respect to the template 200 in the plane of the wafer 100, can be changed. The pressing force can be changed by adjusting a pressurizing force with respect to the template stage 21 with the pressurizing unit 23. The pressing speed and the releasing speed can be changed by adjusting a rising and falling speed of the template stage 21 with the hoisting unit 24. The resist dropping amount can be changed by adjusting a dropping amount of the resist with the dropping unit 50.

The storage unit 63a stores a recipe table including a plurality of recipes with different processing parameters. In FIG. 8A and FIG. 8B, an example of the recipe table is illustrated.

FIG. 8A is a dropping recipe table retained by the imprint apparatus 1a according to the modification example of the first embodiment, and FIG. 8B is an imprint recipe table retained by the imprint apparatus 1a according to the modification example of the first embodiment. In a plurality of processing parameters, the resist dropping amount follows a dropping recipe, and the gap between the template 200 and the wafer 100, the pressing force, the pressing speed, and the releasing speed follow an imprint recipe.

In FIG. 8A and FIG. 8B, an upward arrow indicates "large", "high", "great", and the like, and a downward arrow indicates "small", "low", "less", and the like. For example, the resist dropping amount is less in the shot region where the elapsed time is short, and is great in the shot region where the elapsed time is long. In addition, for example, the gap between the template 200 and the wafer 100, is large in the shot region where the elapsed time is short, and is small in the shot region where the elapsed time is long. In addition, for example, the pressing speed is low in the shot region where the elapsed time is short, and is high in the shot region where the elapsed time is long. However, such setting of the processing parameter is merely an example, and can be suitably changed. In addition, the processing parameter that can be incorporated in the recipe, is not limited to the example of FIG. 8A and FIG. 8B.

Next, a processing example of the imprint apparatus 1a will be described by using FIG. 9.

Figure 9:
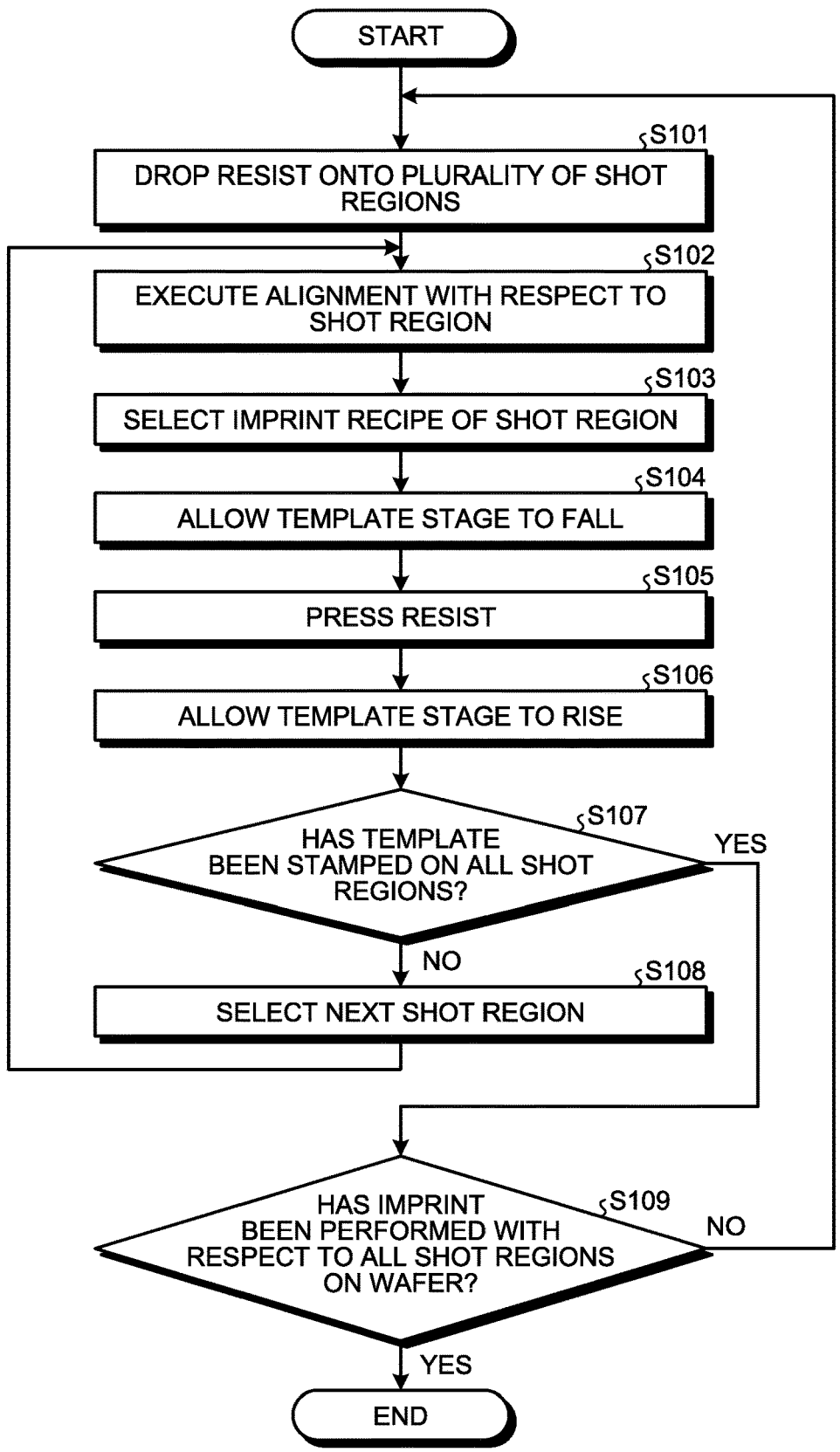
FIG. 9 is a flow diagram illustrating an example of a procedure of imprint processing in the imprint apparatus according to the modification example of the first embodiment.

FIG. 9 is a flow diagram illustrating an example of a procedure of imprint processing in the imprint apparatus 1a according to the modification example of the first embodiment. As illustrated in FIG. 9, the control unit 60a moves the wafer stage 10, and drops the resist onto the plurality of shot regions with the dropping unit 50 (Step S101). At this time, the counting unit 61a counts the order of dropping the resist with respect to each of the shot regions. The recipe selection unit 62a selects the dropping recipe different with respect to each of the shot regions, according to the order of dropping the resist. The dropping unit 50 changes the dropping amount of the resist with respect to each of the shot regions, according to the selected dropping recipe.

The control unit 60a moves a predetermined shot region in the shot regions onto which the resist is dropped, to the lower side of the template 200, and executes alignment (Step S102). The recipe selection unit 62a selects the imprint recipe suitable for the shot region, according to the order of dropping the resist (Step S103).

The hoisting unit 24 allows the template stage 21 to fall (Step S104). At this time, the hoisting unit 24 adjusts a falling speed of the template stage 21, that is, a pressing speed of the template 200, according to the selected imprint recipe.

The pressurizing unit 23 presses the resist on the wafer 100 while pressurizing the rear surface of the template 200. At this time, a pressing force of the template 200 with respect to the wafer 100 is adjusted according to the selected imprint recipe.

The hoisting unit 24 allows the template stage 21 to rise (Step S106). At this time, the hoisting unit 24 adjusts a rising speed of the template stage 21, that is, a releasing speed of the template 200 from the resist pattern, according to the selected imprint recipe.

The control unit 60a determines whether or not the template 200 has been stamped on all of the shot regions onto which the resist is dropped (Step S107). When the stamping with respect to all of the shot regions is not ended (Step S107: No), the control unit 60a selects the next shot region (Step S108). Then, the control unit 60a repeats the processings from Step S102 to Step S106.

When the stamping with respect to all of the shot regions onto which the resist is dropped, is ended (Step S107: Yes), the control unit 60a determines whether or not the imprint processing with respect to all of the shot regions on the wafer 100 is ended (Step S109). When the imprint processing with respect to all of the shot regions is not ended (Step S109: No), the processings from Step S101 to Step S108 are repeated. When the imprint processing with respect to all of the shot regions is ended (Step S109: Yes), the control unit 60a ends the imprint processing.

As described above, the imprint processing in the imprint apparatus 1a is ended.

However, in order to set the recipe as illustrated in FIG. 8A and FIG. 8B described above, it is necessary to condition the processing parameter for each of the shot regions, according to the order of dropping the resist, that is, the length of the elapsed time from when the resist is dropped to when the template 200 is stamped. Such a conditioning procedure will be described by using FIG. 10 and FIG. 11.

Figure 10:
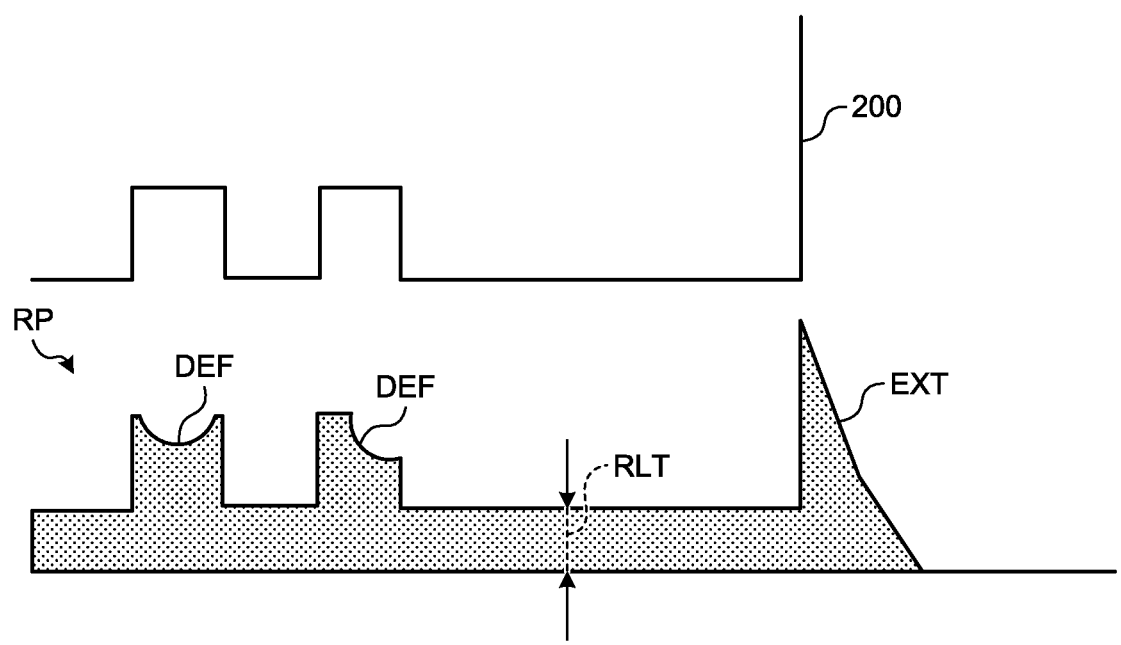
FIG. 10 is a schematic view illustrating some finishing properties of a resist pattern.

FIG. 10 is a schematic view illustrating some finishing properties of a resist pattern RP. As illustrated in FIG. 10, in the imprint processing, examples of the finishing properties of the resist pattern RP to be noted, include a protrusion defect EXT, a pattern defect DEF, a residual layer thickness RLT, and the like.

When the template 200 is pressed against the resist on the wafer 100, the resist bleeding from an end portion of the template 200, creeps up the edge of the template 200, and is photo-cured as it is, and thus, the protrusion defect EXT occurs.

When the concave portion of the fine pattern of the template 200 is filled with the resist, the resist is photo-cured in a state where the filling is not sufficient, and thus, the pattern defect DEF occurs.

The residual layer thickness RLT is the thickness of the resist residual layer generated in each of the patterns of the resist pattern RP due to the gap between the wafer 100 and the template 200. It is preferable that the residual layer thickness RLT is less than or equal to a predetermined value, and it is preferable that the residual layer thickness RLT is homogeneous in the shot region and for each of the shot regions.

Such finishing properties, for example, are changed by changing each of the processing parameters described above.

FIG. 11 is a diagram illustrating an example of a relationship between the processing parameter and the finishing properties. In FIG. 11, an upward arrow represented in the section of each of the processing parameters, and the section of the finishing properties, indicates "large", "high", "great", "thick", and the like. In addition, a downward arrow represented in the section of the finishing properties, indicates "small", "low", "less", "thin", and the like. For example, the protrusion defect EXT decreases, the pattern defect DEF increases, and the residual layer thickness RLT decreases, as the gap between the template 200 and the wafer 100 increases. In addition, for example, the protrusion defect EXT decreases, the pattern defect DEF increases, and the residual layer thickness RLT increases, as the pressing speed increases. In addition, for example, the protrusion defect EXT increases, the pattern defect DEF decreases, and the residual layer thickness RLT increases, as the resist dropping amount increases.

Thus, a plurality of processing parameters in a trade-off relationship, are suitably adjusted, and thus, it is possible to adjust the finishing properties of the resist pattern RP to be appropriate. For example, the flow of FIG. 9 described above, is repeated while changing each of the processing parameters at the time of conditioning the processing parameter, and the finishing properties of the resist pattern RP are adjusted. However, the relationship between the processing parameter and the finishing properties of the resist pattern RP, illustrated in FIG. 11, is merely an example, and can be suitably changed. In addition, the processing parameter that can be used in the conditioning, is not limited to the example of FIG. 11.

The effect of the imprint apparatus 1a of the modification example of the first embodiment will be described.

The finishing properties of the resist pattern RP, illustrated in FIG. 11, can also be changed according to the length of the elapsed time of each of the shot regions. For example, in the shot region where the elapsed time is long, the spreading of the droplet is large, and thus, the protrusion defect EXT easily occurs, and the pattern defect DEF tends to decrease. On the other hand, in the shot region where the elapsed time is short, the spreading of the droplet is small, and thus, the protrusion defect EXT rarely occurs, and the pattern defect DEF tends to increase.

In the imprint apparatus 1a of the modification example of the first embodiment, various processing parameters are changed for each of the shot regions, according to the length of the elapsed time. Accordingly, it is possible to suppress a variation in the finishing properties of the resist pattern RP for each of the shot regions, and to make the finishing properties appropriate in the plurality of shot regions.

Furthermore, in the modification example of the first embodiment described above, the recipe is selected according to the order of dropping the resist, counted by the counting unit 61a, but it is not limited thereto. For example, the counting unit may directly count the elapsed time from when the resist is dropped to when the template is stamped. Alternatively, a spreading condition of the droplet may be observed by the imaging device or the like of the alignment unit, and the recipe may be selected according to the observation.

Second Embodiment

An imprint apparatus 2 of a second embodiment will be described by using FIG. 12 to FIG. 14A and FIG. 14B. The imprint apparatus 2 of the second embodiment is different from the imprint apparatus 1 of the first embodiment, in that the spreading of the droplet in the shot region where the elapsed time is long, is suppressed.

Figure 12:
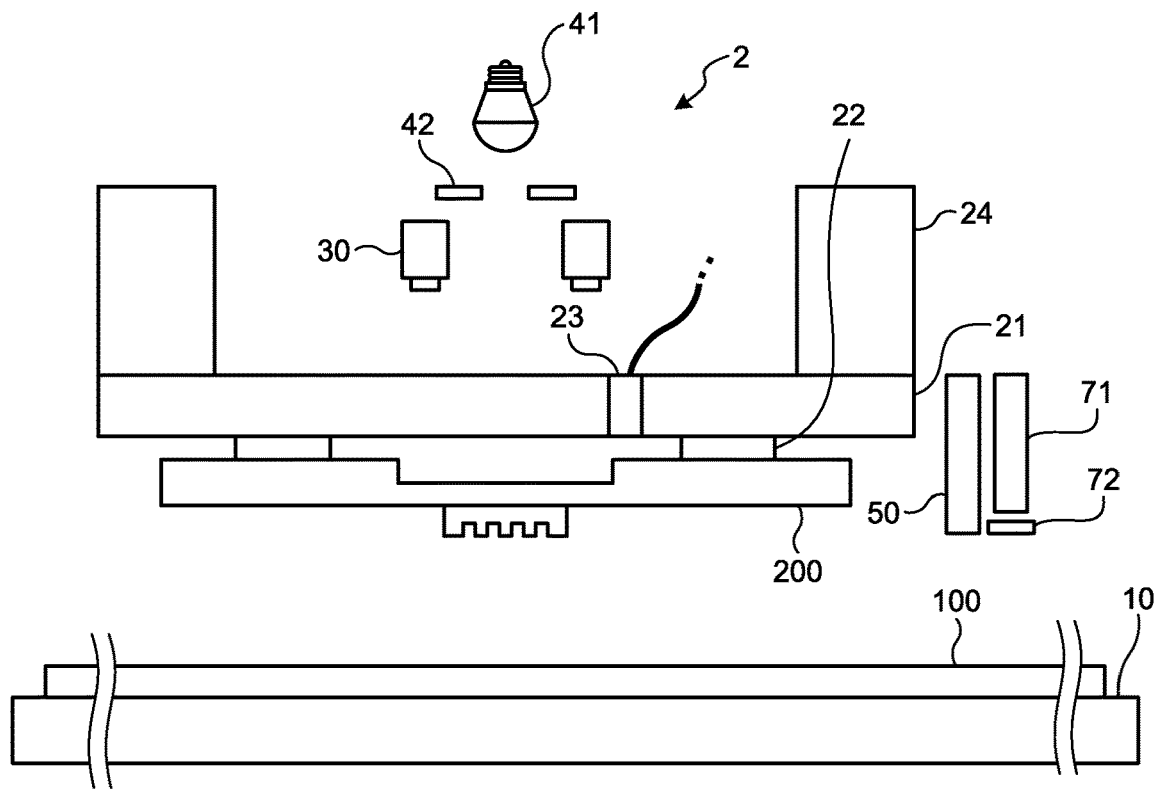
FIG. 12 is a diagram illustrating a configuration example of an imprint apparatus according to a second embodiment.

FIG. 12 is a diagram illustrating a configuration example of the imprint apparatus 2 according to the second embodiment. The imprint apparatus 2 is different from the imprint apparatus 1 of the first embodiment, in that an irradiation unit 71 and a light intensity changing unit 72 are provided, and a configuration of a control unit 160 controlling each unit, is different from that of the first embodiment. The same reference numerals as the reference numerals of the imprint apparatus 1 of the first embodiment, will be applied to other configurations, and the description thereof will be omitted.

As illustrated in FIG. 12, the imprint apparatus 2 includes the irradiation unit 71 adjacent to the dropping unit 50, and the light intensity changing unit 72 arranged on the lower side of the irradiation unit 71. The irradiation unit 71 irradiates the droplet dropped onto the wafer 100 from the dropping unit 50, with light. It is preferable that the light to be applied, is light having a wavelength longer than the wavelength of an ultraviolet ray to be applied from the light source 41. The light intensity changing unit 72 changes the intensity of the light to be applied to the droplet, with a shutter, a diffuser plate, or the like. The intensity of the light is changed according to an opening and closing interval of the shutter and the number of times of opening and closing, or a diffusion condition of the light. That is, it is possible to increase the intensity of the light by increasing an opening interval of the shutter or by increasing the number of opening times. In addition, it is possible to decrease the intensity of the light by further diffusing light. Thus, the light having a wavelength longer than the wavelength of an ultraviolet ray, is used, and the light intensity is adjusted, and thus, it is possible to semi-cure the droplet. The semi-curing indicates a state in which the droplet is not completely cured, and the viscosity increases.

The control unit 160 includes a counting unit 161, an irradiation adjusting unit 162, and a storage unit 163. The counting unit 161, the irradiation adjusting unit 162, and the storage unit 163 may be realized by allowing the CPU to execute a program, or may be realized by a dedicated hardware circuit. In addition, the storage unit 163 may be realized by an HDD or the like.

The counting unit 161 counts the order of dropping the droplet onto the shot regions to be collectively processed. From the order of dropping the droplet, it is possible to predict the elapsed time of each of the shot regions.

In a case where the dropping unit 50 drops the droplet, the irradiation adjusting unit 162 irradiates the shot region with the light from the irradiation unit 71. More specifically, the irradiation adjusting unit 162 irradiates the droplet in each of the shot regions, with light, while adjusting the intensity of the light with the irradiation unit 71 and the light intensity changing unit 72, according to the order of dropping the droplet, that is, the elapsed time to be predicted.

Figure 13:
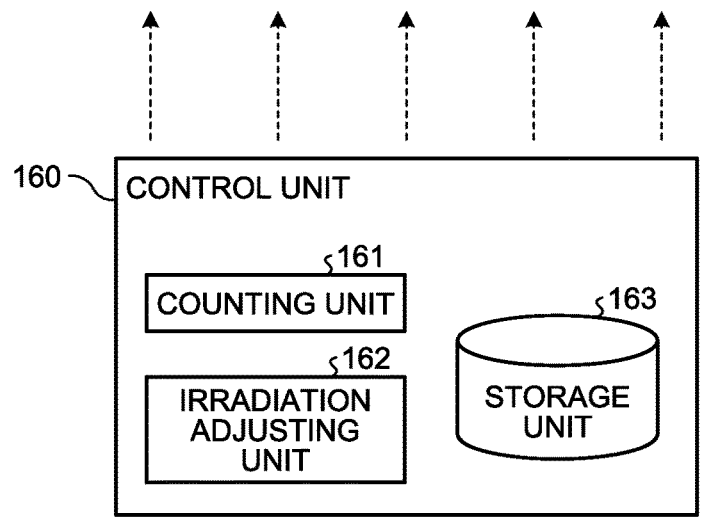
FIG. 13 is an irradiation condition table retained by the imprint apparatus according to the second embodiment.

The storage unit 163 stores an irradiation condition table based on a relationship between an intensity of light irradiation with respect to the droplet, and the length of the elapsed time. In FIG. 13, an example of the irradiation condition table is illustrated.

FIG. 13 is the irradiation condition table retained by the imprint apparatus 2 according to the second embodiment. In FIG. 13, an upward arrow indicates "high", and a downward arrow indicates "low". That is, the intensity of the light increases in the shot region where it is predicted that the elapsed time becomes long, and decreases in the shot region where it is predicted that the elapsed time becomes short. However, such setting of the light intensity is merely an example, and can be suitably changed.

Next, a dropping processing example in the imprint apparatus 2 will be described by using FIG. 14A and FIG. 14B.

Figure 14A:
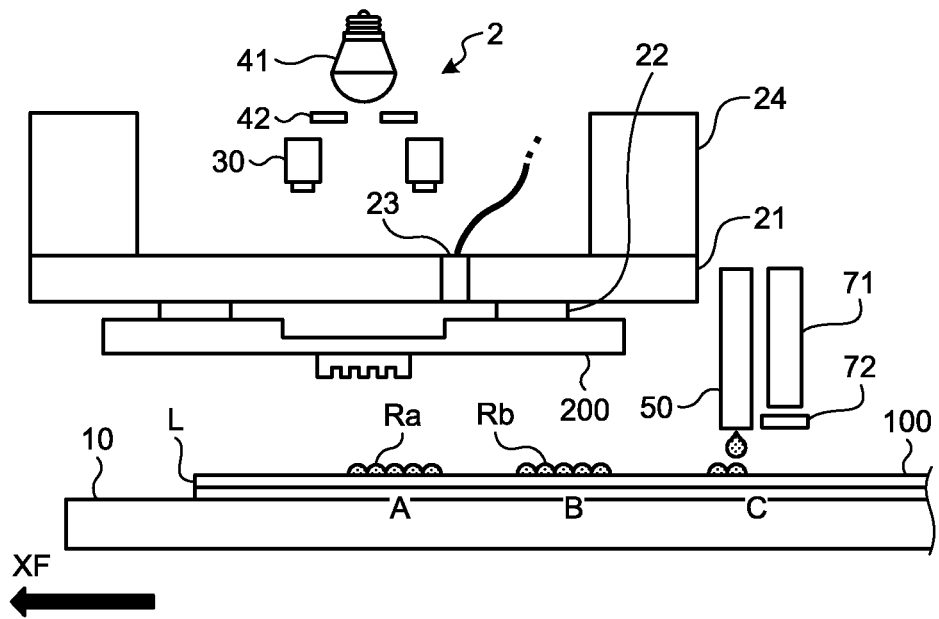
FIG. 14A and FIG. 14B are flow diagrams illustrating an example of a procedure of resist dropping processing of the imprint apparatus according to the second embodiment.
Figure 14B:
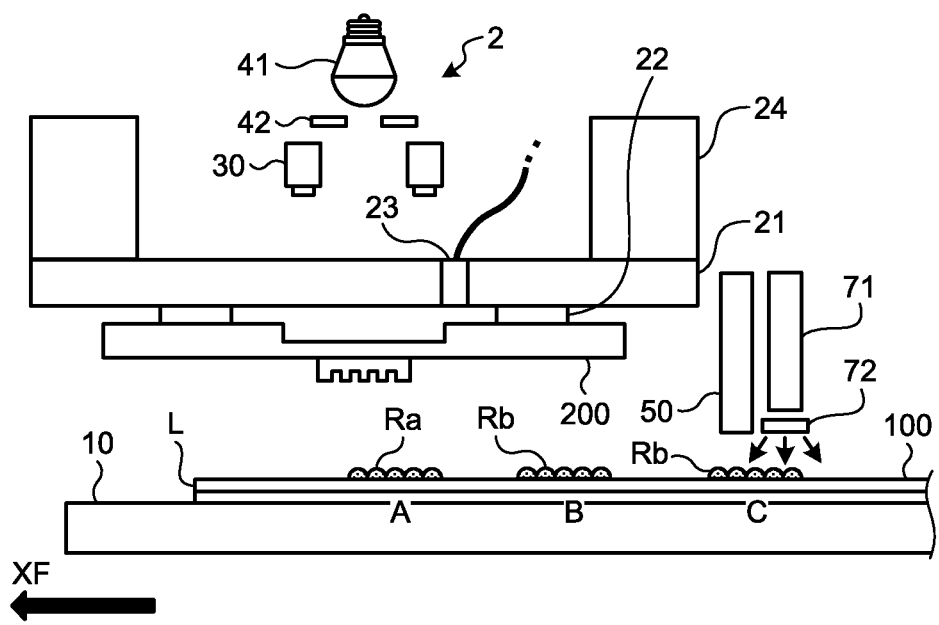

FIG. 14A and FIG. 14B are flow diagrams illustrating an example of a procedure of resist dropping processing of the imprint apparatus 2 according to the second embodiment. As illustrated in FIG. 14A and FIG. 14B, the wafer stage 10 of the imprint apparatus 2 moves the shot regions A, B, C, D, E, and F, in this order, to the resist dropping position of the dropping unit 50. The dropping unit 50 sequentially drops the droplet of the resist onto each of the shot regions A to F. The irradiation unit 71 sequentially irradiates the droplet in each of the shot regions A to F, with light, while changing the light intensity with the light intensity changing unit 72.

FIG. 14A illustrates a state in which the wafer stage 10 is sequentially moved in the XF direction, the dropping of the droplet Ra with respect to the shot region A and the light irradiation, and the dropping of the droplet Rb with respect to the shot region B and the light irradiation are ended, and the dropping of the resist with respect to the shot region C is performed.

FIG. 14B illustrates a state in which the dropping of the resist with respect to the shot region C is ended, and the droplet Rc of the shot region C is irradiated with light. As with the first embodiment described above, the template 200 is stamped on each of the shot regions A to F onto which the droplet is dropped in the order of the shot regions A, B, C, D, E, and F, in the order of the shot regions F, E, D, C, B, and A. In this case, it is predicted that the elapsed time becomes long in the order of the shot regions F, E, D, C, B, and A.

Therefore, the irradiation adjusting unit 162 adjusts the irradiation unit 71 and the light intensity changing unit 72 to obtain a third highest light intensity subsequent to the shot regions A and B, and irradiates the droplet Rc of the shot region C, with light. Accordingly, the droplet Rc is in a state where the viscosity increases subsequent to the droplets Ra and Rb of the shot regions A and B, and is in a state where the spreading is suppressed subsequent to the droplets Ra and Rb. The light irradiation with respect to the droplet Rc is ended, and then, the wafer stage 10 is further moved in the XF direction, and the shot region D is moved to the resist dropping position.

Thus, the droplet is irradiated with light, while decreasing the light intensity in the order of the shot regions A, B, C, D, E, and F. Accordingly, in the shot regions A to F having different elapsed times, the spreading conditions of the droplet are approximately the same.

Figure 15:
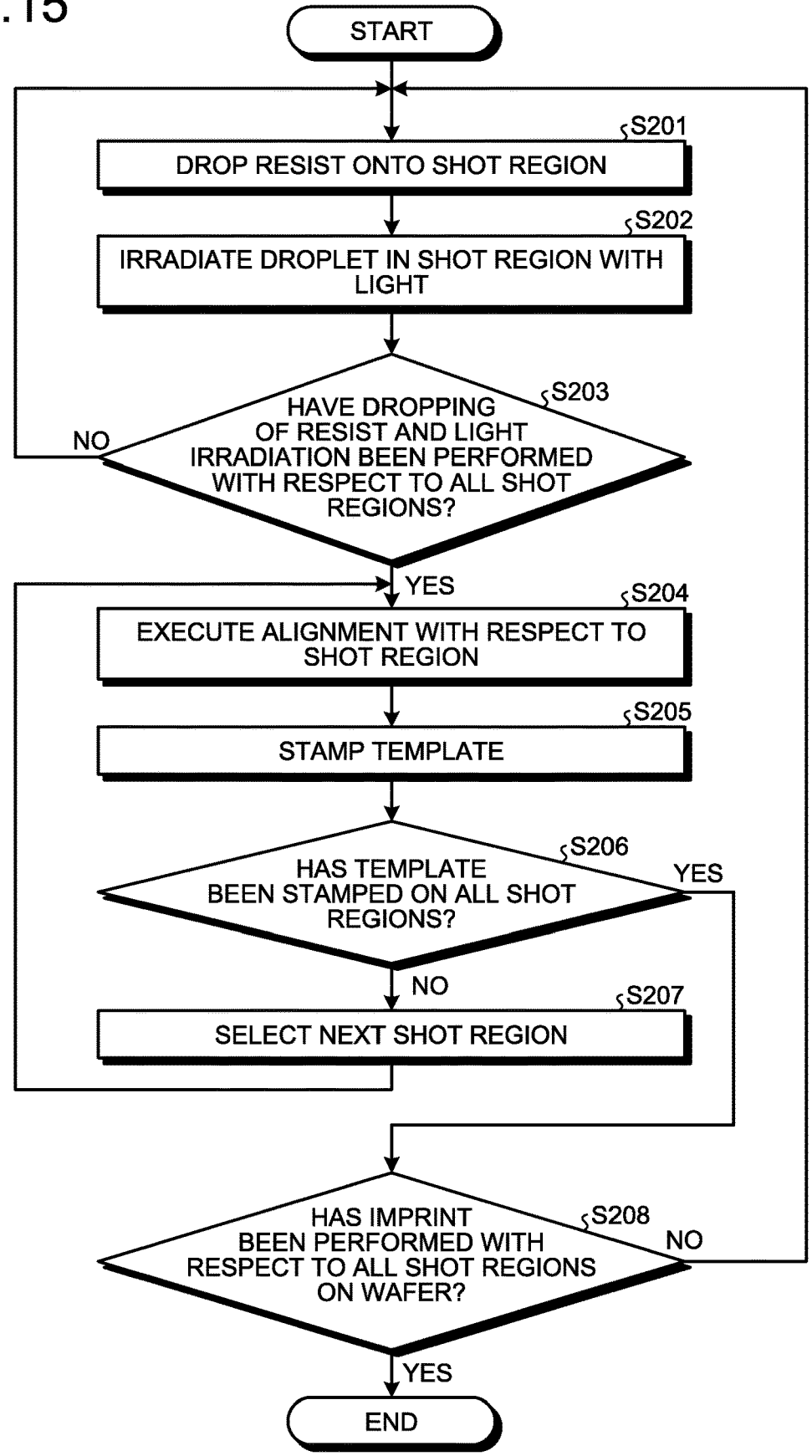
FIG. 15 is a flow diagram illustrating an example of a procedure of imprint processing in the imprint apparatus according to the second embodiment.

A processing example in the imprint apparatus 2 will be further described by using FIG. 15.

FIG. 15 is a flow diagram illustrating an example of a procedure of imprint processing in the imprint apparatus 2 according to the second embodiment. As illustrated in FIG. 15, the dropping unit 50 drops the droplet of the resist onto a predetermined shot region (Step S201). At this time, the counting unit 161 counts which shot region in the shot regions to be collectively processed, is the shot region. At this time, the dropping unit 50, for example, drops the droplet by using the same dropping recipe, regardless of which shot region is the shot region. The irradiation adjusting unit 162 adjusts the irradiation unit 71 and the light intensity changing unit 72, according to the order counted by the counting unit 161, and irradiates the droplet in the shot region with light at a predetermined light intensity (S202).

The control unit 160 determines whether or not the dropping of the resist and the light irradiation with respect to all of the shot regions to be collectively processed, are ended (Step S203). When the dropping of the resist and the light irradiation with respect to all of the shot regions are not ended (Step S203: No), the control unit 160 repeats the processings of Steps S201 and S202.

When the dropping of the resist and the light irradiation with respect to all of the shot regions are ended (Step S203: Yes), the control unit 160 executes alignment with respect to a predetermined shot region, in the shot regions (Step S204). The control unit 160 stamps the template 200 on the resist in the shot region (Step S205). At this time, the control unit 160, for example, performs the imprint processing by using the same imprint recipe, regardless of which shot region is the shot region.

The control unit 160 determines whether or not the stamping of the template 200 with respect to all of the shot regions subjected to the dropping of the droplet and the light irradiation, is ended (Step S206). When the stamping with respect to all of the shot regions is not ended (Step S206:

No), the control unit 160 repeats the processings of Steps S204 and S205. When the stamping with respect to all of the shot regions is ended (Step S206: Yes), the control unit 160 determines whether or not the imprint processing with respect to all of the shot regions on the wafer 100 is ended (Step S208).

When the imprint processing with respect to all of the shot regions is not ended (Step S208: No), the processings of Step S201 to Step S207 are repeated. When the imprint processing with respect to all of the shot regions is ended (Step S208: Yes), the control unit 160 ends the imprint processing.

As described above, the imprint processing in the imprint apparatus 2 is ended.

The imprint apparatus 2 of the second embodiment also has the effect of the first embodiment.

In addition, in the imprint apparatus 2 of the second embodiment, the droplet in the shot regions A to F having different elapsed times, is irradiated with light having different intensities. Accordingly, the spreading conditions of the droplet in the shot regions A to F are approximately the same, and it is possible to suppress a variation in the finishing properties of the resist pattern. Accordingly, for example, it is possible to process each of the shot regions by using the same dropping recipe and the same imprint recipe.

Furthermore, in the second embodiment described above, an example in which the imprint processing is performed by using the same dropping recipe and the same imprint recipe, has been described, but it is not limited thereto. For example, the processing parameter may be changed for each of the shot regions, in addition to irradiating each of the shot regions with light by changing the light intensity according to the elapsed time. Accordingly, it is possible to further suppress a variation in the finishing properties of the resist pattern.

When the processing parameter is changed in addition to the light irradiation with respect to each of the shot regions, for example, it is possible to suitably adjust the plurality of processing parameters for each of the shot regions, according to the relationship between the processing parameter and the finishing properties, as illustrated in FIG. 16.

FIG. 16 is a diagram illustrating an example of the relationship between the processing parameter and the finishing properties. In FIG. 16, an upward arrow represented in the section of each of the processing parameters, and the section of the finishing properties, indicates "large", "high", "great", "thick", and the like. In addition, a downward arrow represented in the section of the finishing properties, indicates "small", "low", "less", "thin", and the like. For example, the protrusion defect decreases, the pattern defect increases, and the residual layer thickness increases, as the intensity of the light irradiation with respect to the droplet increases. However, the relationship between the processing parameter and the finishing properties of the resist pattern, illustrated in FIG. 16, is merely an example, and can be suitably changed. In addition, the processing parameter that can be used in the conditioning, is not limited to the example of FIG. 16.

First Modification Example

Next, an imprint apparatus 2a of a first modification example of the second embodiment, will be described by using FIG. 17. In the imprint apparatus 2a of the first modification example of the second embodiment, configurations of an irradiation unit 71a and a light intensity changing unit 72a, and a control unit 160a controlling each unit, are different from those of the imprint apparatus 2 of the second embodiment. The same reference numerals as the reference numerals of the imprint apparatus 2 of the second embodiment, will be applied to other configurations, and the description thereof will be omitted.

FIG. 17 is a diagram illustrating a configuration example of the imprint apparatus 2a according to the first modification example of the second embodiment. As illustrated in FIG. 17, the imprint apparatus 2a includes the irradiation unit 71a adjacent to the light source 41, and the light intensity changing unit 72a arranged on the lower side of the irradiation unit 71a. The irradiation unit 71a irradiates the droplet dropped onto the wafer 100 from the dropping unit 50, with light. It is preferable that the light to be applied, is light having a wavelength longer than the wavelength of an ultraviolet ray to be applied from the light source 41. The light intensity changing unit 72a changes the intensity of the light to be applied to the droplet, with a shutter, a diffuser plate, or the like.

In addition to this or instead thereof, the light intensity changing unit 72a changes an intensity distribution of the light in the shot region, by a photomask or the like. The photomask, for example, includes a light shielding film shielding light with respect to the central portion of the shot region, and mainly irradiates an outer circumferential portion of the shot region, with the light from the irradiation unit 71a. Accordingly, in the droplet of the resist in the shot region, the outer circumferential portion is semi-cured into the shape of a frame. On the apparatus configuration, there is a relatively a margin in a space in the vicinity of the light source 41, and thus, for example, it is possible to arrange the light intensity changing unit 72a having the configuration of the photomask or the like.

The control unit 160a includes the counting unit 161, an irradiation adjusting unit 162a, and the storage unit 163. The counting unit 161, the irradiation adjusting unit 162a, and the storage unit 163 may be realized by allowing the CPU to execute a program, or may be realized by a dedicated hardware circuit. In addition, the storage unit 163 may be realized by an HDD or the like.

The irradiation adjusting unit 162a irradiates the droplet in each of the shot regions, with light, while adjusting the intensity of the light with the irradiation unit 71a and the light intensity changing unit 72a, according to the order of dropping the droplet, that is, the elapsed time to be predicted.

In the imprint apparatus 2a of the first modification example of the second embodiment, the droplet is semi-cured into the shape of a frame, by the light intensity changing unit 72a including the photomask or the like. Accordingly, it is possible to further suppress the spreading of the droplet.

In addition, in the imprint apparatus 2a of the first modification example of the second embodiment, the droplet is semi-cured into the shape of a frame, and thus, the spreading of the droplet in the central portion of the shot region due to its own weight, is not inhibited. Accordingly, for example, the filling of the concave portion of the template 200 with the resist is accelerated while suppressing the protrusion defect in the outer circumferential portion, and thus, it is easy to suppress the pattern defect.

Second Modification Example

An imprint apparatus of a second modification example of the second embodiment is different from that of the second embodiment described above, in that the light source has a function of an irradiation unit that irradiates the droplet with light. Accordingly, it is possible to further simplify the device configuration.

Furthermore, the light intensity changing unit including the shutter, the diffuser plate, the photomask, or the like, described above, may be arranged on the lower side of the light source.

Other Embodiments

In the first embodiment, the second embodiment, and the like, described above, the template stage 21 is moved to the lower side, and the template 200 is pressed against the wafer 100, but it is not limited thereto. The wafer stage may be moved to the upper side, and the wafer may be pressed against the template, and thus, the fine pattern of the template may be stamped on the resist on the wafer. Thus, the template and the wafer are pressed against each other by the template stage moved to the lower side, or the template stage maintaining a predetermined position, and thus, the fine pattern of the template is stamped on the wafer.

The control units 60, 60*a*, 160, and 160*a* of the imprint apparatus 1, 1*a*, 2, and 2*a* of the first embodiment, the second embodiment, and the like, described above, may be incorporated in the imprint apparatus 1, 1*a*, 2, and 2*a*, or may remotely control each unit by being disposed in a position separated from the imprint apparatus 1, 1*a*, 2, and 2*a*. In both cases, the imprint apparatus 1, 1*a*, 2, and 2*a* of the first embodiment, the second embodiment, and the like, include a receiving unit receiving a control signal from the control units 60, 60*a*, 160, and 160*a*, and thus, each unit may be controlled according to the control signal from the control units 60, 60*a*, 160, and 160*a*, the control signal being received by the receiving unit. In addition, in both cases, the imprint apparatus 1, 1*a*, 2, and 2*a* of the first embodiment, the second embodiment, and the like, can also be regarded as an imprint system including the control units 60, 60*a*, 160, and 160*a*.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint apparatus that presses a pattern of an original plate against a photo-curable resin dropped onto a substrate, and transfers the pattern to the photo-curable resin by applying light, the apparatus comprising:
   a dropping unit that drops the photo-curable resin onto a plurality of shot regions obtained by dividing the substrate into a plurality of sections;
   an original plate supporting unit that contacts the pattern of the original plate to the photo-curable resin on the substrate;
   a substrate supporting unit that supports the substrate and moves the substrate, a predetermined shot region of the substrate being moved to a dropping position of the dropping unit or a contacting position of the original plate; and
   a processor including a counting unit that counts an order in which the photo-curable resin is dropwise for each of the plurality of shot regions,
   wherein the dropping unit is controlled to drop the photo-curable resin onto the plurality of shot regions of the substrate sequentially before contacting the original plate to the photo-curable resin on any of the plurality of shot regions, and
   the original plate supporting unit is controlled to contact the original plate to the photo-curable resin dropped onto the plurality of shot regions sequentially based on the order of a dropwise of the photo-curable resin to transfer the pattern to the resin, while operating the substrate supporting unit.

2. The imprint apparatus according to claim 1,
   wherein the dropping unit is controlled such that the photo-curable resin is dropped in the order of a first shot region and a second shot region, and
   the original plate supporting unit is controlled such that the pattern is transferred by contacting the original plate on the photo-curable resin, in an order of the second shot region and the first shot region so as that the order of imprinting the shot regions is a reverse order of the order of the dropwise of the photo-curable resin.

3. The imprint apparatus according to claim 1, further comprising:
   an irradiation unit that irradiates light onto a liquid droplet of the photo-curable resin dropped onto a predetermined shot region determined based on the order of the dropwise of the photo-curable resin before the original plate is contacted,
   wherein the irradiation unit is positioned between the original plate supporting unit and the dropping unit in a horizontal direction.

4. The imprint apparatus according to claim 3, further comprising:
   a light intensity changing unit that changes an intensity of light to be applied to the liquid droplet of the photo-curable resin from the irradiation unit.

5. The imprint apparatus according to claim 4,
   wherein the light intensity changing unit is a shutter or a diffuser plate.

6. The imprint apparatus according to claim 3,
   wherein the irradiation unit is disposed to be adjacent to the dropping unit.

7. The imprint apparatus according to claim 3, further comprising:
   a light source that is positioned above the original plate supporting unit overlapping the original plate supported with the original plate supporting unit in vertical direction, and irradiates light to the photo-curable resin to transfer the pattern of the original plate to the photo-curable resin in a state in which the original plate is contacted to the photo-curable resin,
   wherein the irradiation unit is positioned between the light source and the dropping unit in the horizontal direction.

8. The imprint apparatus according to claim 1, further comprising:
   an irradiation unit that irradiates light to a liquid droplet of the photo-curable resin dropped onto the substrate, before the original plate is contacted,
   wherein an intensity of light applied to the liquid droplet is changed among the plurality of shot regions, the intensity being changed according to a length of a time from when the photo-curable resin is dropped to when the original plate is contacted to the photo-curable resin.

9. The imprint apparatus according to claim 8,
wherein the intensity of the light applied to the liquid droplet increases as the time from when the photo-curable resin is dropped to when the original plate is stamped on the photo-curable resin, increases, in the plurality of shot regions.

10. The imprint apparatus according to claim 1,
wherein at least any one of a contacting speed of the original plate, a pressing force of the original plate with respect to the photo-curable resin, and a releasing speed of the original plate from the photo-curable resin is changed in the plurality of shot regions, according to a length of a time from when the photo-curable resin is dropped to when the original plate is contacted on the photo-curable resin.

11. The imprint apparatus according to claim 1, further comprising:
a storage unit in which a plurality of recipes having a plurality of different processing parameters are stored,
wherein the processor includes a selection unit that selects a recipe used for each of the plurality of shot regions among of the plurality of recipes based on the order of a dropwise of the photo-curable resin.

\* \* \* \* \*